(12) United States Patent
Xu et al.

(10) Patent No.: US 8,962,371 B2
(45) Date of Patent: Feb. 24, 2015

(54) METHOD FOR FABRICATING SENSOR

(71) Applicant: Beijing BOE Optoelectronics Technology Co., Ltd., Beijing (CN)

(72) Inventors: Shaoying Xu, Beijing (CN); Zhenyu Xie, Beijing (CN); Xu Chen, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/126,490

(22) PCT Filed: Nov. 21, 2012

(86) PCT No.: PCT/CN2012/084976
§ 371 (c)(1),
(2) Date: Dec. 16, 2013

(87) PCT Pub. No.: WO2014/015589
PCT Pub. Date: Jan. 30, 2014

(65) Prior Publication Data
US 2014/0342490 A1 Nov. 20, 2014

(30) Foreign Application Priority Data

Jul. 26, 2012 (CN) .......................... 2012 1 0262564

(51) Int. Cl.
*H01L 21/00* (2006.01)
*H01L 27/146* (2006.01)
(52) U.S. Cl.
CPC .... *H01L 27/14692* (2013.01); *H01L 27/14687* (2013.01)
USPC ........................................... 438/59; 438/155

(58) Field of Classification Search
CPC .................. H01L 27/14603; H01L 27/14692; H01L 27/14689; H01L 27/14643
USPC ...................... 438/57, 59, 65, 66, 73, 151, 155
See application file for complete search history.

(56) References Cited

U.S. PATENT DOCUMENTS 6,300,159 B1 * 10/2001 Mochizuki ...................... 438/67
7,902,004 B2 * 3/2011 Weisfield et al. .............. 438/151
(Continued)

FOREIGN PATENT DOCUMENTS

CN 101567378 A 10/2009

OTHER PUBLICATIONS

First Office Action issued by the Chinese Patent Office 201210262564.3 dated May 30, 2014, 6 pgs.
(Continued)

*Primary Examiner* — Kevin M Picardat

(57) ABSTRACT

A method for fabricating a sensor, comprises: forming, on a base substrate, a pattern of a data line (31), a pattern of a drain electrode (34), a pattern of a source electrode (33), a pattern of a receive electrode (39), a pattern of a photodiode (40) and a pattern of a transparent electrode (41); forming a pattern of an ohmic layer by using a first patterning process; forming a pattern of an active layer by using a second patterning process; forming a pattern of a gate insulating layer by using a third patterning process; and forming a pattern of a gate line (30), a pattern of a gate electrode (38) and a pattern of a bias electrode (42) by using a fourth patterning process. Such a method can reduce the number of mask as well as the production cost and simplifies the production process, thereby significantly improves the production capacity and the defect-free rate.

11 Claims, 4 Drawing Sheets

(56) References Cited

U.S. PATENT DOCUMENTS

| | | | | |
|---|---|---|---|---|
| 8,497,562 | B2* | 7/2013 | Ishida et al. | 257/458 |
| 8,729,478 | B2* | 5/2014 | Tredwell et al. | 250/362 |
| 2008/0245968 | A1* | 10/2008 | Tredwell et al. | 250/370.09 |
| 2010/0237250 | A1 | 9/2010 | Hayashi | |
| 2011/0127593 | A1* | 6/2011 | Hayashi | 257/292 |
| 2012/0153173 | A1* | 6/2012 | Chang et al. | 250/370.08 |

OTHER PUBLICATIONS

English translation of First Office Action issued by the Chinese Patent Office 201210262564.3 dated May 30, 2014, 3 pgs.

International Search Report for International Application No. PCT/CN2012/084976, 11 pgs.

\* cited by examiner

A-A'

B-B'

US 8,962,371 B2

METHOD FOR FABRICATING SENSOR

CROSS REFERENCE TO RELATED APPLICATIONS

This application is based on International Application No. PCT/CN2012/084976 filed on Nov. 21, 2012, which claims priority to Chinese National Application No. 201210262564 filed on Jul. 26, 2012, the contents of which are incorporated herein by reference.

FIELD OF THE ART

Embodiments of the invention relate to a method for fabricating a sensor.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is sensor.

FIG. 1 illustrates a basic configuration of a sensor. The sensor 12 comprises a plurality of scan lines 15, a plurality of data lines 16 and a plurality of sensing elements, each of the sensing elements comprises a photodiode 13 and a field effect transistor (FET) 14. The gate of the FET 14 is connected with a corresponding scan line 15 of the sensor 12, the drain of the FET 14 is connected with a corresponding data line 16 of the sensor 12, and the source of the FET 14 is connected to the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected with the FET 14 and the data readout circuit 18, and capturing of the photocurrent signal is realized by controlling signal timing on the scan line 15 and the data line 16. That is to say, the capturing of the photocurrent signal is controlled by controlling the ON/OFF state of the FET 14.

Currently, sensors generally employ a thin film transistor (TFT) plate configuration. Such a sensor may have many layers in its cross section. For example, each sensing element comprises a substrate, a gate electrode layer, a gate insulating layer, an active layer, a source electrode and a drain electrode layer, a passivation layer, PIN junction of the PIN photosensor, a transparent electrode window layer, and a bias layer as well as a light-shield strip layer. Detailed patterning layers may differ from each other for different sensors, depending on the specific configuration of the sensors.

Individual patterning layers of the sensor are generally formed via patterning processes and each patterning process generally comprises steps of masking, developing, exposure, etching and peeling. That is to say, multiple patterning processes are needed to realize multiple patterning layers of the sensor. For example, 9 to 11 patterning processes are needed to form a multi-layer sensor as described above, thereby 9 to 11 masks are required, which makes the fabrication cost high and the process complicated and the production capacity difficult to increase.

SUMMARY

The invention aims to provide a fabrication method of a sensor so as to overcome the technical problems of sensors having high production cost and complicated fabrication processes and difficulty in improving the production capacity.

An embodiment of the invention provides a method for fabricating a sensor, comprising:

forming, on a base substrate, a pattern of a data line, a pattern of a drain electrode connected with the data line, a pattern of a source electrode arranged opposed to the drain electrode to form a channel, a pattern of a receive electrode connected with the source electrode, a pattern of a photodiode disposed on the receiving electrode and a pattern of a transparent electrode disposed on the photodiode;

forming a pattern of an ohmic layer disposed on the source electrode and the drain electrode, by using a first patterning process;

forming a pattern of an active layer disposed on the ohmic layer and overlaying the channel, by using a second patterning process;

forming a pattern of a gate insulating layer disposed on the active layer, by using a third patterning process; and forming a pattern of a gate line disposed on the gate insulating layer, a pattern of a gate electrode disposed on the gate line and a pattern of a bias electrode deposed on the transparent electrode, by using a fourth patterning process.

The TFT device of the sensor in the embodiment of the invention is a top gate TFT. In comparison with the conventional technologies, the method for fabricating the sensor in accordance with the invention reduces the number of used masks and the production cost, and improves the production capacity and defect-free rate of the products.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
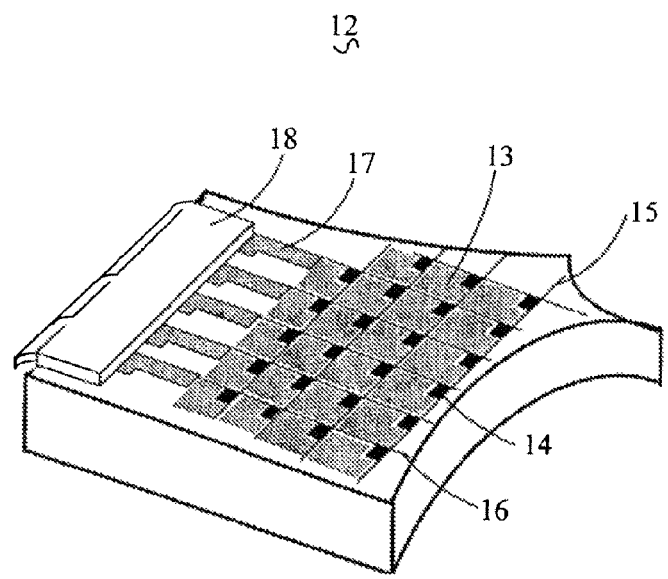
FIG. 1 schematically illustrates a three-dimensional (3-D) configuration of a conventional sensor.

12: sensor; 13: photodiode; 14: field effect transistor (FET) 15: scan line 16: data line 17: connecting pin
18: data readout circuit 30: gate line 31: data line
32: base substrate 33: source electrode 34: drain electrode
35: ohmic layer 36: active layer 37: gate insulating layer
38: gate electrode 39: receive electrode 40: photodiode
41: transparent electrode 42: bias electrode 40a: N-type semiconductor
40b: I-type semiconductor 40c: P-type semiconductor 43: passivation layer
30a: single-gate line 30b: double-gate line 50: TFT device
51: photodiode device

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the invention described below, a sensor may be an X-ray sensor or other type of sensors, such as a sensor transmitting signals via photo-electric conversion. The following descriptions and drawings are for a single sensing element while other sensing elements may be formed in the same way.

Figure 2:
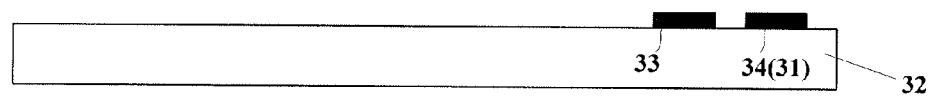
FIG. 2 schematically illustrates a cross section taken along the line A-A' of FIG. 14 after the step 11 for the sensing element in accordance with an embodiment of the invention.
Figure 3:
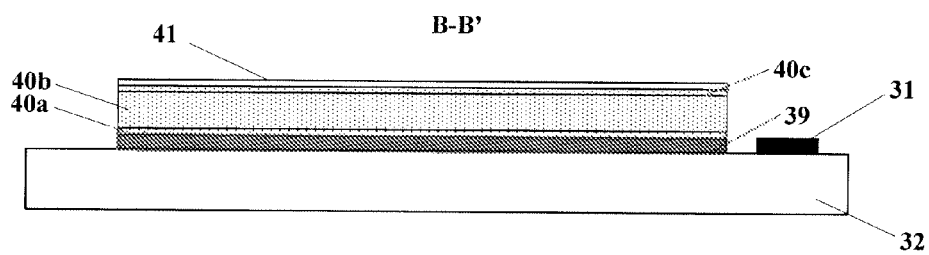
FIG. 3 schematically illustrates a cross section taken along the line B-B' of FIG. 14 after the step 11 for the sensing element in accordance with an embodiment of the invention.
Figure 12:
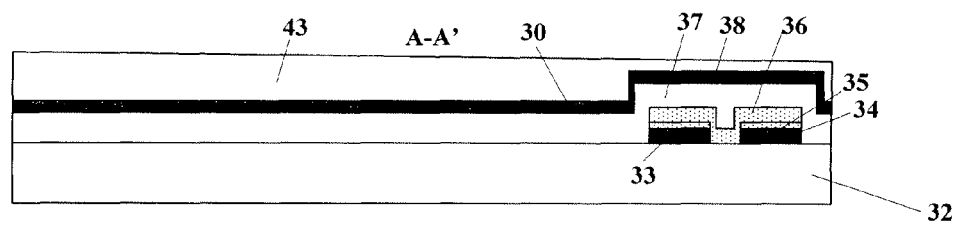
FIG. 12 schematically illustrates a cross section taken along the line A-A' of FIG. 14 after the step 16 for the sensing element in accordance with an embodiment of the invention.
Figure 13:
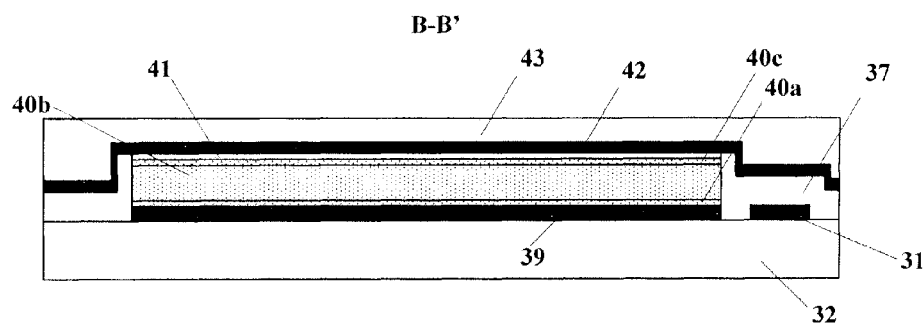
FIG. 13 schematically illustrates a cross section taken along the line B-B' of FIG. 14 after the step 16 for the sensing element in accordance with an embodiment of the invention.
Figure 14:
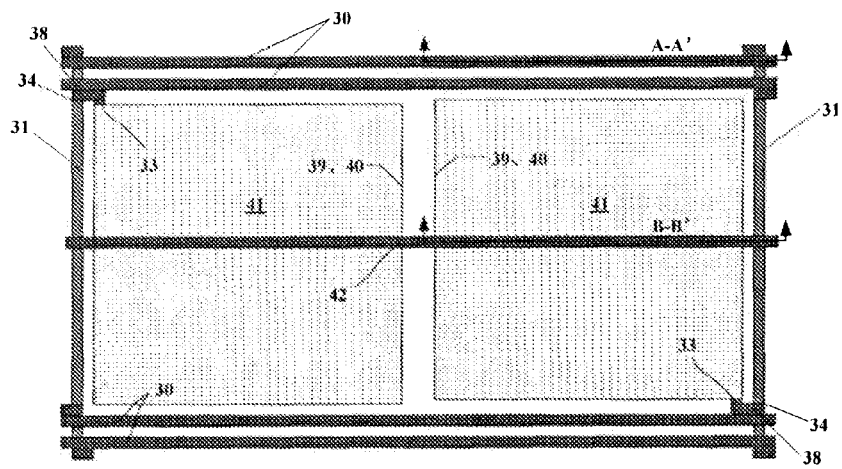
FIG. 14 schematically illustrates a top view of a sensing element of a sensor fabricated by the method in accordance with an embodiment of the invention.

An embodiment of the invention provides a sensor and its fabrication method to address the technical problems of sensors having high cost and complicated fabrication processes in the conventional art. The method comprises:

Step 11: a pattern of the data line 31, a pattern of the drain electrode 34 connected with the data line 31, a pattern of the source electrode 33 arranged opposed to the drain electrode 34 to form a channel, a pattern of the receive electrode 39 connected with the source electrode 33, a pattern of the photodiode 40 disposed on the receiving electrode 39 and a pattern of the transparent electrode 41 disposed on the photodiode 40 are formed on the base substrate 32. FIGS. 2 and 3 illustrate the cross section of the base substrate after the step, the base substrate is only a similar cross section taken along the lines A-A' and B-B' of FIG. 14 and does not represent real base substrate of FIG. 14, because FIG. 14 represents the final sensor element obtained from a series of steps of the method in the present embodiment. Similarly, FIGS. 4 to 13 are illustrated in the same way.

Figure 4:
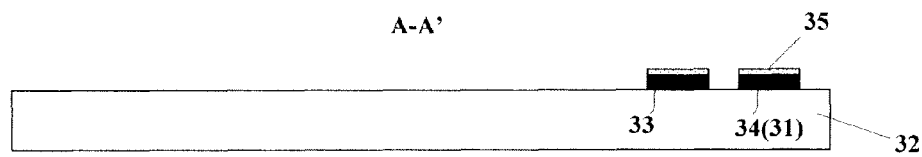
FIG. 4 schematically illustrates a cross section taken along the line A-A' of FIG. 14 after the step 12 for the sensing element in accordance with an embodiment of the invention.
Figure 5:
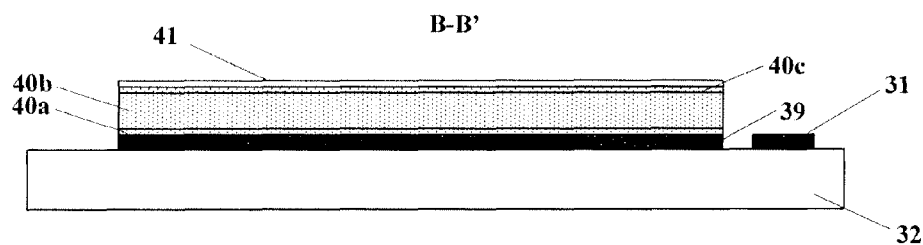
FIG. 5 schematically illustrates a cross section taken along the line B-B' of FIG. 14 after the step 12 for the sensing element in accordance with an embodiment of the invention.

Step 12: a single patterning process is used to form a pattern of the ohmic layer 35 on the source electrode 33 and the drain electrode 34. A cross section of the base substrate after the step is illustrated in FIGS. 4 and 5.

Figure 6:
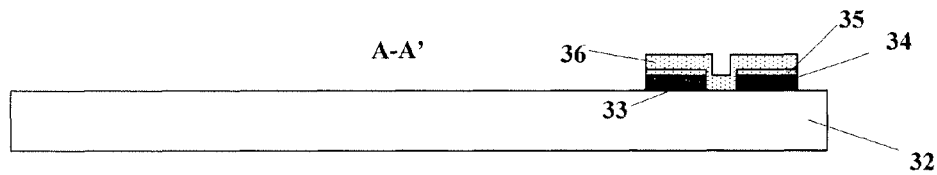
FIG. 6 schematically illustrates a cross section taken along the line A-A' of FIG. 14 after the step 13 for the sensing element in accordance with an embodiment of the invention.
Figure 7:
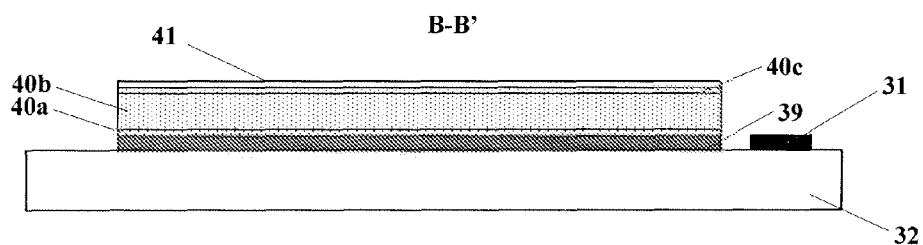
FIG. 7 schematically illustrates a cross section taken along the line B-B' of FIG. 14 after the step 13 for the sensing element in accordance with an embodiment of the invention.

Step 13: a single patterning process is used to form a pattern of the active layer 36 on the ohmic layer 35 and overlaying the channel. A cross section of the base substrate after the step is illustrated in FIGS. 6 and 7.

Figure 8:
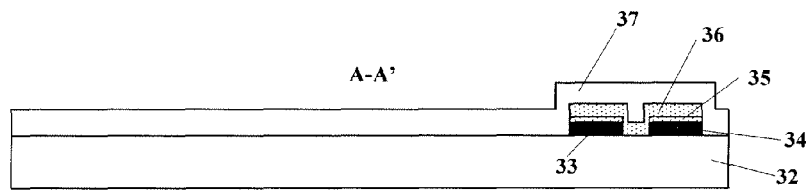
FIG. 8 schematically illustrates a cross section taken along the line A-A' of FIG. 14 after the step 14 for the sensing element in accordance with an embodiment of the invention.
Figure 9:
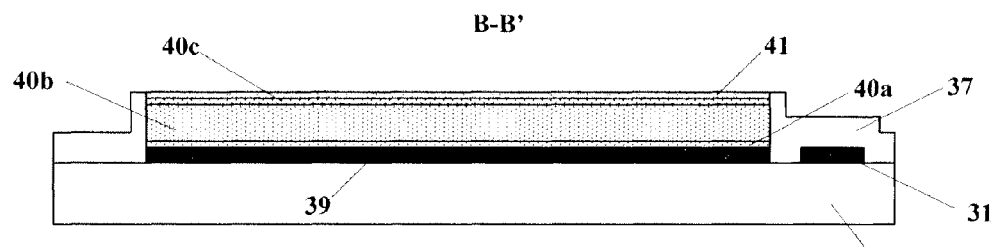
FIG. 9 schematically illustrates a cross section taken along the line B-B' of FIG. 14 after the step 14 for the sensing element in accordance with an embodiment of the invention.

Step 14: a single patterning process is used to form a pattern of the gate insulating layer 37 on the active layer 36. A cross section of the base substrate after the step is illustrated in FIGS. 8 and 9.

Figure 10:
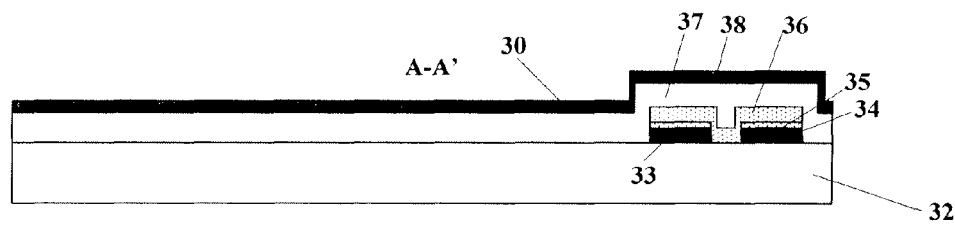
FIG. 10 schematically illustrates a cross section taken along the line A-A' of FIG. 14 after the step 15 for the sensing element in accordance with an embodiment of the invention.
Figure 11:
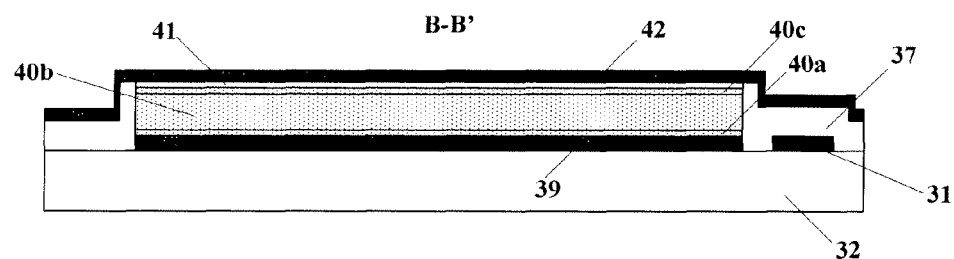
FIG. 11 schematically illustrates a cross section taken along the line B-B' of FIG. 14 after the step 15 for the sensing element in accordance with an embodiment of the invention.

Step 15: a single patterning process is used to form a pattern of the gate line 30 on the gate insulating layer 37, a pattern of a gate electrode 38 connected with the gate line 30 and a pattern of a bias electrode 42 on the transparent electrode 41. A cross section of the base substrate after the step is illustrated in FIGS. 10 and 11.

In an embodiment of the invention, after the formation of the pattern of the gate line 30, the pattern of the gate electrode 38, and the pattern of the bias electrode 42 on the on the transparent electrode 41, the method may further comprises:

Step 16: a single patterning process is used to form a pattern of the passivation layer 43 on the gate line 30, the gate electrode 38, the bias electrode 42 and overlaying the base substrate, the passivation layer 43 has a signal-transmitting region via hole (at the peripheral of the base substrate, but not shown in figures). Step 16 is optional, as the invention can still be realized without step 16. Therefore, in an embodiment, the method for fabricating the sensor may only comprises the above steps 11 to 15.

FIG. 14 is a top view of a sensing element of a sensor in accordance with the fabricating method (after the step 16). FIGS. 12 and 13 are cross sections of the sensing element along the lines A-A' and B-B' of the FIG. 14, respectively.

In an embodiment of the invention, a single patterning process sequentially comprises steps of substrate cleaning, film forming, photoresist application, exposure, developing, etching, photoresist removal and so on. The substrate may be cleaned using de-ionized water or an organic cleanser. The film forming process is to form the structural layers to be patterned. For example, a metal layer is generally formed using Physical Vapor Deposition (PVD), such as magnetron sputtering, and then wet etched to form a pattern. While a non-metal layer is usually formed using Chemical Vapor Deposition (CVD) and then dry etched to form a pattern.

In the step 11, the pattern of the transparent electrode 41 can be formed using wet etching single, and also can be formed using dry etching together with the photodiode 40.

In an embodiment of the invention, the base substrate 32 may be a glass substrate, a plastic substrate or a substrate made of other materials; the gate line 31, the source electrode 33, the drain electrode 34 and the receiving electrode 39 may be of the same material such as a single layer film made of aluminum neodymium (AlNd) alloy, aluminum (Al), copper (Cu), molybdenum (Mo), molybdenum tungsten (MoW) alloy or chromium (Cr), or a multi-layer film made of any combination of these metals or alloys. The single layer or multi-layer film may have a thickness of for example 150 nm to 450 nm.

In an embodiment of the invention, a material of the ohmic layer 35 may be for example a doped semiconductor (n+a-Si); a material of the active layer 36 may be a semiconducting material, such as, amorphous silicon (a-Si), with a thickness of 30 nm to 250 nm; a material of the gate insulating layer 37 may be silicon nitrides with a thickness of 300 nm to 500 nm; the gate line 30, the gate electrode 38 and the bias electrode 42 may be of the same material, preferably heavy metals or heavy metal alloys, such as copper lead alloy; the transparent electrode 41 may be transparent conductive materials such as indium tin oxides (ITO) or indium zinc oxides (IZO). The first passivation layer 43 may be made of an inorganic insulating film (such as silicon nitrides) or an organic insulating film (such as a photosensitive resin material or a non-photosensitive resin) with a thickness of, for example, 150 nm to 1500 nm.

In an embodiment of the invention, the gate line 31, the source electrode 33, the drain electrode 34 and the receiving electrode 39 are of the same material preferably. The photodiode 40 is preferably a PIN photodiode comprising: an N-type semiconductor 40a, an I-type semiconductor 40b and a P-type semiconductor 40c. A PIN photodiode works based on photovoltaic principle and has the advantages of having small junction capacitance, short transit time and high sensitivity. The PIN-type photodiode structure is equivalent to a PN junction having a thick intrinsic amorphous silicon layer in the middle of the PN junction, wherein the P-type material is formed by mixing the intrinsic material with a dopant for providing holes, the N-type is formed by mixing the intrinsic material with a dopant for providing electrons. In other embodiments of the invention, the photodiode may be a MIS (Metal-Insulator-Semiconductor)-type photodiode and the like.

In an embodiment of the invention, the formation of the pattern of the data line 31, the pattern of the drain electrode 34, the pattern of the source electrode 33, the pattern of photodiode 40 and the pattern of the transparent electrode 41 in the step 11 may be formed on the base substrate by using a single patterning process. For example, when the photodiode is a PIN photodiode, alternatively, the step 11 comprises:

Step 111, sequentially depositing the data line material layer, the N-type semiconductor layer, the I-type semiconductor layer, the P-type semiconductor layer and the transparent conductive material layer on the base substrate 32;

Step 112, applying the photoresist;

Step 113, exposing the base substrate using a mask having a light-transmitting portion, a partial-light-transmitting portion and a light-blocking portion;

Step 114, developing to remove the photoresist correspond to the light-transmitting portion;

Step 115, etching the base substrate to form the pattern of the receive electrode 39, the pattern of photodiode 40 and the pattern of the transparent electrode 41;

Step 116, ashing the base substrate to remove the photoresist correspond to the partial-light-transmitting portion;

Step 117, etching the base substrate to remove the transparent conductive material layer, the P-type semiconductor layer, the I-type semiconductor layer and the N-type semiconductor layer corresponding to the partial-light-transmitting portion, and peeling the photoresist, to form the pattern of the data line 31, the pattern of the drain electrode 34 and the pattern of the source electrode 33.

In an embodiment of the invention, the mask used in the step 113 may be a gray tone mask or a half-tone mask, etc. The light-blocking portion of the mask correspondingly forms a region having the receive electrode 39, the PIN photodiode and the transparent electrode 41, and the partial-light-transmitting portion of the mask correspondingly forms a region having the data line 31, the source electrode 33 and the drain electrode 34.

Alternatively, in another embodiment of the invention, the step 11 can be achieved by using two patterning processes, which specifically comprise the following steps:

Step 21, a single patterning process is used to form, on the base substrate 32, a pattern of the data line 31, a pattern of a drain electrode 34 connected with the data line 31, a pattern of a source electrode 33 arranged opposed to the drain electrode 34 to form a channel and a pattern of a receive electrode 39 connected with the source electrode 33;

Step 22, a single patterning process is used to form a pattern of a photodiode 40 on the receiving electrode 39 and a pattern of a transparent electrode 41 on the photodiode 40.

In the step 22, when the photodiode 40 is a PIN photodiode comprising an N-type semiconductor, an I-type semiconductor and a P-type semiconductor, the step 22 comprises:

Sequentially depositing an N-type semiconductor layer, an I-type semiconductor layer, a P-type semiconductor layer and the transparent conductive material layer, and forming a pattern of the photodiode 40 and a pattern of the transparent electrode 41 by using a single patterning process.

In an embodiment of the invention, the TFT device of the sensor is a top gate TFT, the method for fabricating the sensor, in comparison with the conventional technology, which reduces the number of mask as well as the production cost and simplifies the production process, thereby significantly improves the production capacity and the defect-free rate.

Figure 15:
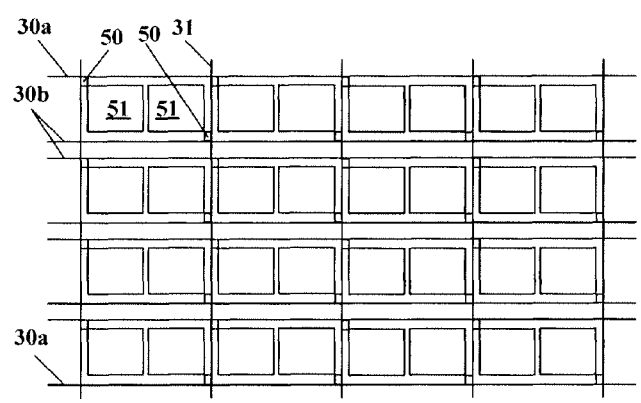
FIG. 15 schematically illustrates a top view of a plurality of sensing elements of a sensor arranged in an array in accordance with an embodiment of the invention.

FIG. 15 is a top view of a plurality of sensing elements of a sensor in accordance with the above fabricating method. As shown in the FIGS. 12-15, the sensor comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises at least one sensing sub-element having a TFT device and a photodiode, in which:

The TFT device comprises: a source electrode 33 and a drain electrode 34 arranged opposed to each other to form a channel on the base substrate 32, the drain electrode 34 is connected with a neighboring data line 31, an ohmic layer 35 on the source electrode 33 and the drain electrode 34, an active layer 36 on the ohmic layer 35 and overlaying the channel, a gate insulating layer 37 on the active layer 36, and a gate electrode 38 on the gate insulating layer 37 and connected with a neighboring gate line 30;

The photodiode sensor device comprises: a receiving electrode 39 disposed on the base substrate 32 and connected with the source electrode 33, a photodiode (PD) 40 disposed on the receiving electrode 39, a transparent electrode 41 disposed on the PD 40, and a bias electrode 42 disposed on the transparent electrode 41.

With continued reference to FIG. 13, in an embodiment of the invention, the photodiode is a PIN photodiode, comprising: an N-type semiconductor (n+a-Si) 40a disposed on the receive electrode 39, an I-type semiconductor (a-Si) 40b disposed on the N-type semiconductor 40a and a P-type semiconductor (p+a-Si) 40c disposed on the I-type semiconductor 40b.

In an embodiment of the invention, the sensor may further comprises: the passivation layer 43 disposed on a group of gate lines 30, the gate electrode 38 and the bias electrode 42 of every sensing element, and overlaying the base substrate, the passivation layer 43 has a signal-transmitting region via hole (FIGS. 12 and 13 illustrate a cross section of a sensing element, therefore, the signal-transmitting region via hole at the peripheral of the base substrate is not shown).

In an embodiment of the invention, as shown in the FIG. 14, the group of gate lines 30 comprises two single-gate lines 30a, and multi-group of double-gate lines 30b between two single-gate lines 30a (a group of double-gate lines 30b comprising two neighboring double-gate lines 30b). Each of the sensing elements comprises two sensor sub-elements; each sub-element comprises a TFT device 50 and a photodiode 51. Two sensor sub-elements of the TFT device 50 is distributed diagonally, and the gate electrode of the TFT device 50 connects with a nearer one of a neighboring single-gate line 30a or a neighboring double-gate line 30b. In the conventional sensor, both gate line and data line are of single line, and there is only one sensing element in the region defined by two neighboring gate lines and two neighboring data lines, the sensing element comprises one TFT device and one photodiode sensor device, that is to say, the sensing element only comprises one sensing sub-element. Thus, in comparison with the conventional sensors, the total number of the gate lines in the embodiment of the present invention is doubled due to the double-gate lines, but the number of the data lines is decreased to a half. Considering that the cost of a gate line driver device is less than the cost of a data line driver device, therefore, the structure can further reduce the cost of the sensor.

What are described above is related to the illustrative embodiments of the disclosure only and not limitative to the scope of the disclosure; the scopes of the disclosure are defined by the accompanying claims.

What is claimed is:

1. A method for fabricating a sensor comprising:
   forming, on a base substrate, a pattern of a data line, a pattern of a drain electrode connected with the data line, a pattern of a source electrode arranged opposed to the drain electrode to form a channel, a pattern of a receive electrode connected with the source electrode, a pattern of a photodiode disposed on the receiving electrode and a pattern of a transparent electrode disposed on the photodiode;
   forming a pattern of an ohmic layer disposed on the source electrode and the drain electrode, by using a first patterning process;
   forming a pattern of an active layer disposed on the ohmic layer and overlaying the channel, by using a second patterning process;
   forming a pattern of a gate insulating layer disposed on the active layer, by using a third patterning process; and
   forming a pattern of a gate line disposed on the gate insulating layer, a pattern of a gate electrode connected with the gate line and a pattern of a bias electrode disposed on the transparent electrode, by using a fourth patterning process.

2. The method of claim 1, after forming the pattern of the gate line, the pattern of the gate electrode and the pattern of the bias electrode, further comprising:
   forming a pattern of a passivation layer disposed on the gate line, the gate electrode and the bias electrode and overlaying the base substrate, by using a fifth patterning process, the passivation layer has a signal-transmitting region via hole.

3. The method of claim 1, wherein the formation of the pattern of data line, the pattern of the source electrode and the drain electrode, the pattern of the receiving electrode, the pattern of the photodiode and the pattern of the transparent electrode is achieved by using a single patterning process.

4. The method of claim 3, wherein the photodiode is a PIN photodiode which comprises an N-type semiconductor, an I-type semiconductor and a P-type semiconductor, and the formation of the pattern of the data line, the pattern of the drain electrode, the pattern of the source electrode, the pattern of the receiving electrode, the pattern of the photodiode and the pattern of the transparent electrode, by using a single patterning process comprises:
   sequentially depositing a data line material layer, an N-type semiconductor layer, an I-type semiconductor layer, a P-type semiconductor layer and a transparent conductive layer on the base substrate, and applying a photoresist to the transparent conductive layer;
   exposing the photoresist on the base substrate by using a mask having a light-transmitting portion, a partial-light-transmitting portion and a light-blocking portion;
   developing the photoresist on the base substrate and etching the base substrate to form the pattern of the receive electrode, the pattern of the photodiode and the pattern of the transparent electrode;
   ashing the base substrate, etching and removing the photoresist on the base substrate, to form the pattern of the data line and the pattern of the source electrode and the drain electrode.

5. The method of claim 4, wherein the light-blocking portion of the mask correspondingly forms a region having the receive electrode, the PIN photodiode and the transparent electrode, and the partial-light-transmitting portion of the mask correspondingly forms a region having the data line, the source electrode and the drain electrode.

6. The method of claim 4, wherein the photoresist in a region of the base substrate which corresponds to a light-transmitting portion is removed in the step of developing the photoresist on the base substrate; the photoresist in a region of the base substrate which corresponds to the partial-light-transmitting portion is removed in the step of ashing the base substrate.

7. The method of claim 1, wherein the formation of the pattern of the data line, the pattern of the source electrode and the drain electrode, the pattern of the receiving electrode, the pattern of the photodiode and the pattern of the transparent electrode is achieved by using two patterning processes, which comprise:
   forming the pattern of the data line, the pattern of the drain electrode connected with the data line, the pattern of the source electrode arranged opposed to the drain electrode to form a channel, the pattern of the receive electrode connected with the source electrode, by using a single patterning process;
   forming the pattern of the photodiode disposed on the receive electrode and the pattern of the transparent electrode disposed on the photodiode by using a single patterning process.

8. The method of claim 7, wherein the photodiode is a PIN photodiode comprising an N-type semiconductor, an I-type semiconductor and a P-type semiconductor, and the formation of the pattern of the photodiode and the pattern of the transparent electrode by using a single patterning process, comprising:
   sequentially depositing an N-type semiconductor layer, an I-type semiconductor layer, a P-type semiconductor layer and a transparent conductive material layer, and forming the pattern of the photodiode and the pattern of the transparent electrode by using a single patterning process.

9. The method of claim 1, wherein the pattern of the transparent electrode is formed by wet etching, or, the pattern of the transparent electrode and the photodiode are formed together by dry etching together.

10. The method of claim 1, wherein the data line, the source electrode, the drain electrode and the receive electrode are of the same material.

11. The method of claim 1, wherein the gate line, the gate electrode and the bias line electrode are of the same material.

\* \* \* \* \*